(12) United States Patent
Liang et al.

(10) Patent No.: US 6,653,245 B2
(45) Date of Patent: Nov. 25, 2003

(54) METHOD FOR LIQUID PHASE DEPOSITION

(75) Inventors: Muh-Wang Liang, MiaoLi (TW); Pang-Min Chiang, Hsinchu (TW); Chen Max, Hsinchu (TW); Jen-Rong Huang, Hsinchu (TW); Ching-Fa Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/874,108

(22) Filed: Jun. 6, 2001

(65) Prior Publication Data

US 2002/0173170 A1 Nov. 21, 2002

(30) Foreign Application Priority Data

May 16, 2001 (TW) ........................................ 90111668 A

(51) Int. Cl.⁷ .............................................. H01L 21/31
(52) U.S. Cl. .................. 438/784; 438/732; 427/563; 427/574; 427/579; 137/251; 137/268; 137/282; 137/297; 137/599; 307/118
(58) Field of Search ................................. 438/784, 732; 427/579, 563, 574; 137/268, 251, 282, 297, 599; 307/118

(56) References Cited

U.S. PATENT DOCUMENTS

| | | | | |
|---|---|---|---|---|
| 5,667,597 A | * | 9/1997 | Ishihara | 136/258 |
| 5,869,149 A | * | 2/1999 | Denison et al. | 427/579 |
| 6,042,901 A | * | 3/2000 | Denison et al. | 427/579 |
| 6,146,940 A | * | 11/2000 | Hong | 438/253 |
| 6,494,608 B1 | * | 12/2002 | Retamal et al. | 366/132 |

* cited by examiner

Primary Examiner—Van Thu Nguyen
Assistant Examiner—Pho Luu
(74) Attorney, Agent, or Firm—Troxell Law Office PLLC

(57) ABSTRACT

A method for liquid phase deposition, including the steps of providing at least two raw materials from at least two supply devices of a saturation reaction system into a mixture trough and stirring until saturation occurs, filtering out unnecessary solid-state particles, and providing saturated and filtered liquid into an over-saturation reaction trough of a steady-flow over-saturation loop reaction system and stopping the saturated and filtered liquid when the over-saturation reaction trough is filled and the saturated and filtered liquid over-flows into a liquid level control trough to a pre-determined level. The method also includes the steps of providing a substrate in the over-saturation reaction trough, providing reactants from at least two supply devices into the over-saturation reaction trough, and depositing a thin film onto the substrate when the saturated liquid becomes over-saturated.

3 Claims, 3 Drawing Sheets

METHOD FOR LIQUID PHASE DEPOSITION

BACKGROUND OF THE INVENTION

1. Field of the Invention

The present invention generally relates to a method and an apparatus for liquid phase deposition, and more particularly, to a method and an apparatus essential for forming a metal/non-metal thin film on a semiconductor substrate via chemical deposition.

2. Description of the Prior Art

In recent years, the fabrication techniques for both ultra large scale integrated circuits (ULSI) and liquid crystal displays (LCDs) tend towards lower temperatures in order to avoid degradation of the device characteristics due to the thermal stress on the thin films. Owing to novel low-temperature related techniques, various low melting-point substrates such as glass substrates and plastic substrates are suitable for use in growth of high-quality thin films with low thermal stress at low temperatures. Therefore, development in low-temperature related techniques has attracted tremendous attention in the industry.

It is well known that silicon oxide is a very important material in the field of semiconductor. Silicon oxide has different applications according to its growing conditions. In early days, silicon oxide was grown in the furnace in the temperature range from 700 to 1000° C. With the improvement in fabrication techniques, a novel silicon oxide growing method known as plasma-enhanced chemical vapor phase deposition (PECVD) has been developed and successfully demonstrated in the temperature range from 300 to 400° C. However, it is notable that such a temperature range for silicon oxide growth by using plasma is still too high for deep sub-micron fabrication process, which may lead to device damage during PECVD operation. Later, high-vacuum sputtering was proposed but limited by its low throughput and possible ion leakage. Accordingly, the fabrication techniques of the new generation for both ultra large scale integrated circuits (ULSI) and liquid crystal displays (LCDs) tend towards lower temperatures. It is beneficial to develop a low-temperature technique for silicon oxide growth without using plasma.

Generally, only low-temperature liquid phase deposition stations are provided with a wet trough. However, the contaminative particles generated in the wet trough make the control difficult for temperature, on-line monitoring system, solution supply, and cleaning, which may cause trouble in on-line mass production techniques. Especially, in the 0.18 □m fabrication process, there is danger in that the chemical vapor in the wet trough may produce contaminants.

Therefore, the present invention provides a method and an apparatus for liquid phase deposition, which employs a closed-loop filter system in order to eliminate contaminative particles during low-temperature liquid phase deposition operation on the substrate. It is advantageous for its easy control and specially designed closed-loop dual-trough system with a steady flow, so as to overcome the problems in the prior art, improve the uniformity of thin film deposition, and achieve the objects of high throughput, high fabrication yield, and low fabrication cost.

SUMMARY OF THE INVENTION

It is the primary object of the present invention to provide an apparatus for liquid phase deposition, and more particularly, an apparatus essential for forming a metal/non-metal thin film on a semiconductor substrate via chemical deposition with high reliability.

It is another object of the present invention to provide a method for liquid phase deposition on a semiconductor substrate, so as to provide high fabrication yield, and eliminate contaminative particles, especially in the 0.18 □m fabrication process.

It is still another object of the present invention to provide a method and an apparatus, employing a specially designed closed-loop filter system in order to fabricate high quality thin films with low thermal stress by performing low-temperature liquid phase deposition operation on a substrate.

In order to achieve the foregoing objects, present invention provides an apparatus for liquid phase deposition, comprising:

a saturation reaction system, including a mixture trough, at least two supply devices for raw materials, a stirrer device, a filter device, and valve control devices;

a steady-flow over-saturation loop reaction system, including an over-saturation reaction trough, at least one liquid level control trough, at least two supply devices for raw materials, a stirrer device, a filter device, and valve control devices;

an automatic solution concentration monitoring system, for controlling the reactant concentrations; and a waste liquid recycling system, comprising at least two storage troughs, a recycled waste liquid level sensor, a recycled waste liquid sensor, and valve control devices.

The present invention also provides a method for liquid phase deposition, comprising the steps of:

providing at least two raw materials from said at least two supply devices of said saturation reaction system into said mixture trough; after stirring by said stirrer device until saturation, filtering out unnecessary solid-state particles by using said filter device; providing saturated and filtered liquid by using said pumps through said valve control devices into said over-saturation reaction trough of said steady-flow over-saturation loop reaction system; stopping providing said saturated and filtered liquid when said over-saturation reaction trough is filled up with said saturated and filtered liquid and said saturated and filtered liquid over-flows into said at least one liquid level control trough to a pre-determined level; switching said valve control devices into a state in which said steady-flow over-saturation loop reaction system runs independently; providing a substrate into said over-saturation reaction trough; providing reactants from said at least two supply devices into said over-saturation reaction trough; and depositing a thin film onto said substrate when said saturated liquid becomes over-saturated.

During the reaction, the generated particles can be filtered out by said filter device, and the reaction conditions can be controlled by said recycled waste liquid level sensor and said heater so as to obtain high-quality thin films.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention provides a method and an apparatus for liquid phase deposition, which employs a closed-loop filter system in order to eliminate contaminative particles during low-temperature liquid phase deposition operation on various low melting-point substrates such as glass substrates and plastic substrates for use in growth of high-quality thin films with low thermal stress at low temperatures.

To begin with, the apparatus for liquid phase deposition according to the present invention comprises: a saturation reaction system, a steady-flow over-saturation loop reaction system, an automatic solution concentration monitoring system, and a waste liquid recycling system.

Figure 1:
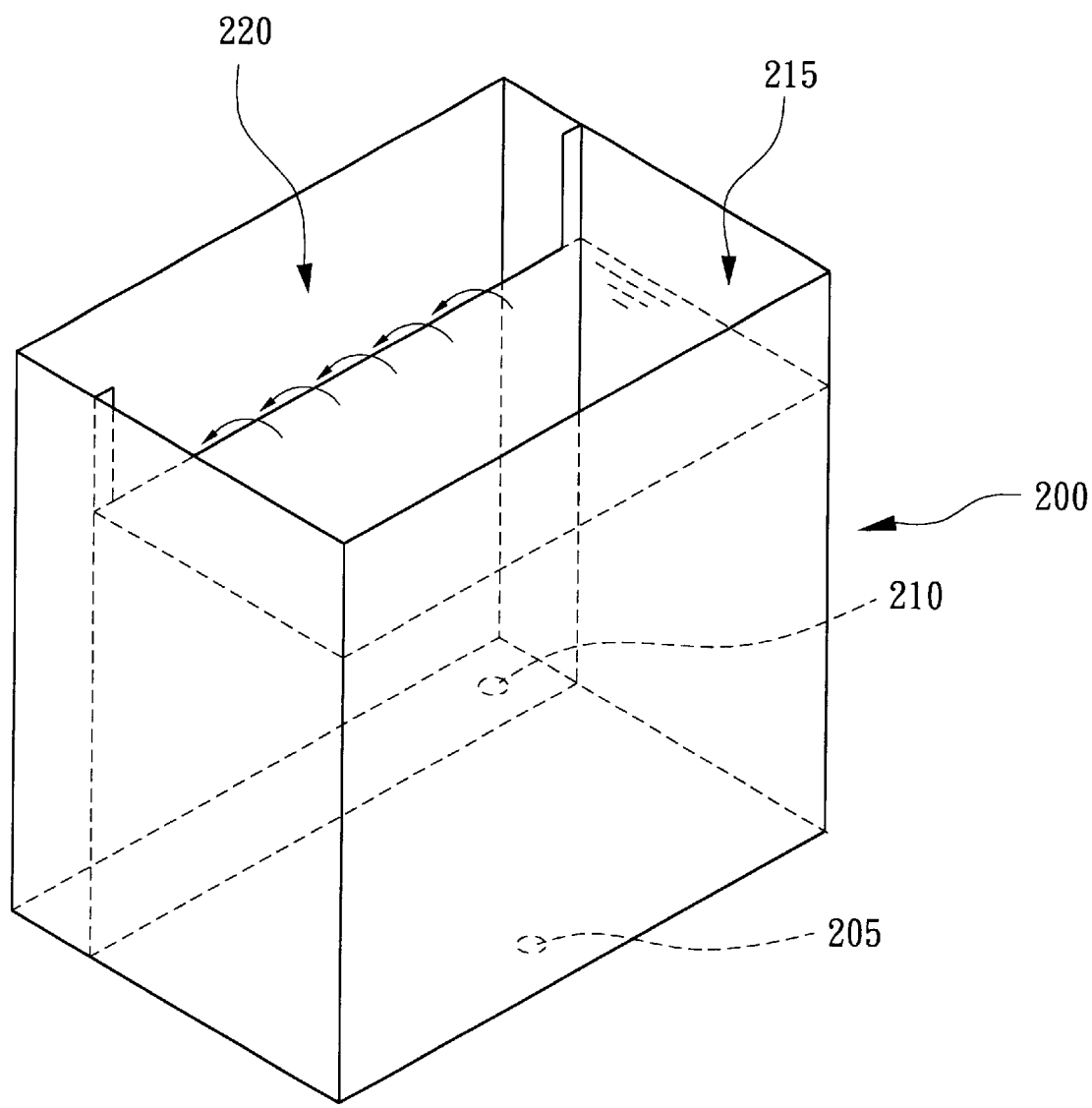
FIG. 1 is a schematic diagram showing an over-saturation reaction trough and a liquid level control trough of a steady-flow over-saturation loop reaction system allowing over-flow on one side in accordance with the preferred embodiment of the present invention.

Please refer to FIG. 1, which is a schematic diagram showing an over-saturation reaction trough 215 and a liquid level control trough 220 in a reaction trough 200 of a steady-flow over-saturation loop reaction system in accordance with the preferred embodiment of the present invention. It is designed to allow over-flow on one side. The reaction trough 200 includes an over-saturation reaction trough 215 and a liquid level control trough 220. On the bottom of the over-saturation reaction trough 215 there is disposed a liquid entry 205 for the supply of reactants; while on the bottom of the liquid level control trough 220 there is disposed a liquid exit 210 for the exhaust of reactants. The reactants enter the over-saturation reaction trough 215 via the liquid entry 205. When the liquid level exceeds the height of the over-saturation reaction trough 215, the reactants over-flow into the liquid level control trough 220 and then exhaust via the liquid exit 210. Such is a design for one-sided over-flow.

Figure 2:
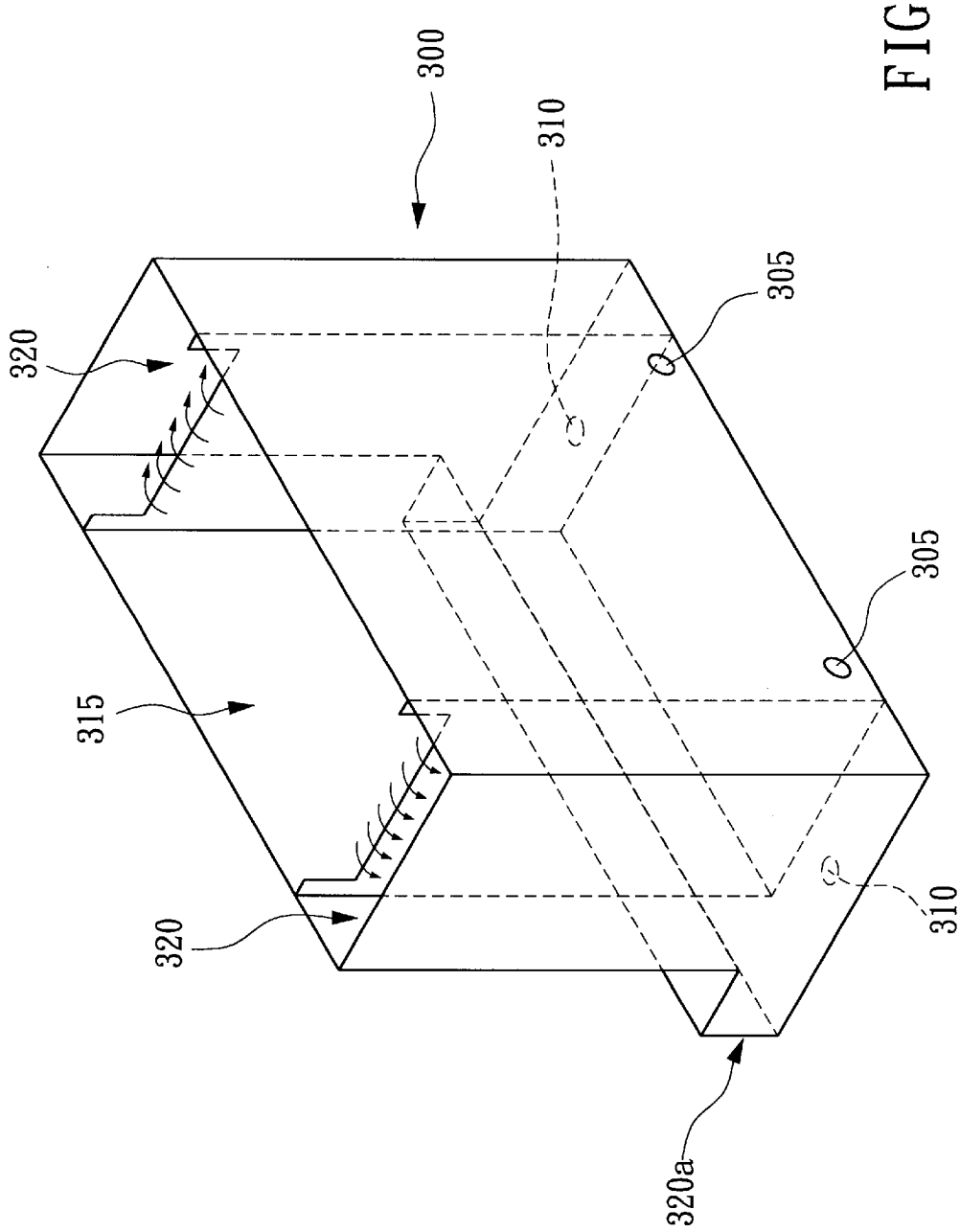
FIG. 2 is a schematic diagram showing an over-saturation reaction trough and two liquid level control troughs of a steady-flow over-saturation loop reaction system allowing over-flow on two opposite sides in accordance with the preferred embodiment of the present invention.

FIG. 2 shows a schematic diagram showing an over-saturation reaction trough 315 and two liquid level control troughs 320 in a reaction trough 300 of a steady-flow over-saturation loop reaction system in accordance with the preferred embodiment of the present invention. It is designed to allow over-flow on two opposite sides. The reaction trough 300 includes an over-saturation reaction trough 315 and two liquid level control troughs 320. On the bottom of the over-saturation reaction trough 315 there are disposed two liquid entries 305 for the supply of reactants; while on the bottom of each of the liquid level control trough 320 there is disposed a liquid exit 310 for the exhaust of reactants. It is notable that on the bottom of the two liquid level control troughs 320 there is a □-shaped channel or a connection tube to interconnect the two liquid level control troughs 320 and balance the liquid heights of the two liquid level control troughs 320. Similarly, the reactants enter the over-saturation reaction trough 315 via the liquid entries 305. When the liquid level exceeds the height of the over-saturation reaction trough 315, the reactants over-flow into the liquid level control troughs 320 on both sides and then exhaust via the liquid exits 310. Such is a design for two-sided over-flow.

Figure 3:
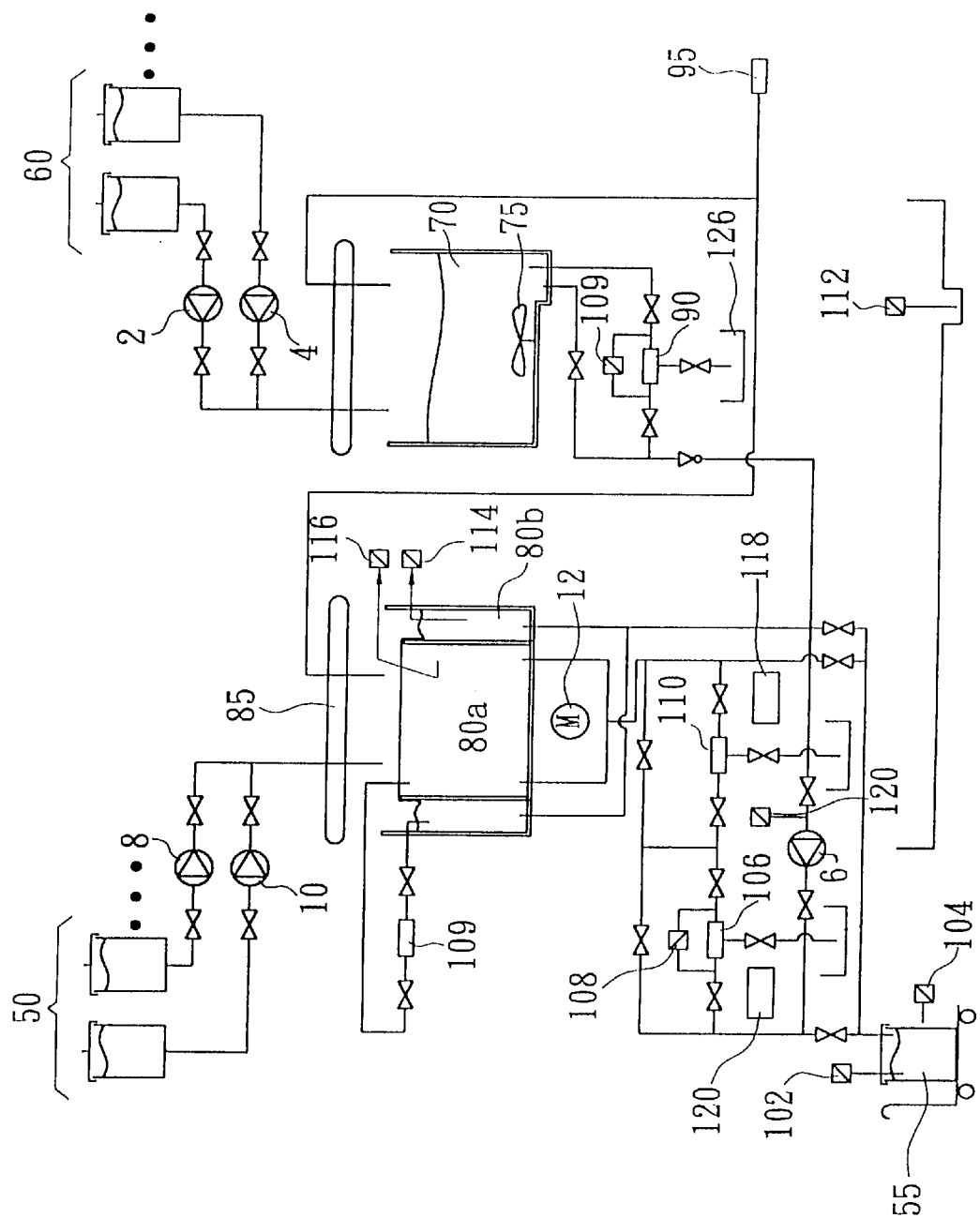
FIG. 3 is a schematic diagram showing an apparatus for liquid phase deposition in accordance with the embodiment of the present invention.

FIG. 3 is a schematic diagram showing an apparatus for liquid phase deposition in accordance with the embodiment of the present invention. The apparatus comprises a saturation reaction system, a steady-flow over-saturation loop reaction system, an automatic solution concentration monitoring system, and a waste liquid recycling system.

The saturation reaction system comprises a mixture trough 70, at least two supply devices 60 for raw materials, a stirrer device 75, a filter device 90, and valve control devices such as pumps 2, 4.

The steady-flow over-saturation loop reaction system includes a over-saturation reaction trough 80a, at least one liquid level control trough 80b, at least two supply devices 50 for raw materials, a stirrer device, a filter device, and valve control devices. The filter device is composed of a pump 6, a filter 106, a filter jamming sensor 108, a heater 110, an over-heating sensor 118, and a pump protection sensor 120.

The automatic solution concentration monitoring system 109 is used to control the reactant concentrations.

The waste liquid recycling system comprises at least two storage troughs 55 for storing the recycled waste liquids, a recycled waste liquid level sensor 102 for detecting the liquid level of the recycled waste liquids, a recycled waste liquid sensor 104, and valve control devices.

The apparatus is used to grow silicon oxide in three ways as described hereinafter, and the chemical reaction is:

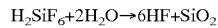
$$H_2SiF_6 + 2H_2O \rightarrow 6HF + SiO_2$$

One of the three ways is by temperature difference during 15 to 20° C. When the temperature decreases, the dissolubility is reduced, enhancing the reaction rate.

The second way is to add de-ionized water to saturated $H_2SiF_6$ so as to deposit $SiO_2$ on the substrate.

The third way is to add $H_3BO_3$ to saturated $H_2SiF_6$ so as to deposit $SiO_2$ on the substrate, and the chemical reaction is expressed as:

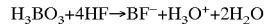
$$H_3BO_3 + 4HF \rightarrow BF^- + H_3O^+ + 2H_2O$$

The spirit of the method according to present invention is described with reference to a preferred embodiment of depositing a $SiO_2$ thin film on the substrate, comprising the steps hereinafter:

Step 1: As shown in FIG. 3, $H_2SiF_6$ and $SiO_2$ or $H_4SiO_4$ powders are provided by two supply devices 60 for raw materials through the pumps 2, 4 into the mixture trough 70. The solution is stirred by the stirrer device 75 until saturation. There is also provided an automatic solution concentration monitoring system 109 is to monitor the reactant concentrations.

Step 2: The valve control devices are switched into the mode of adding raw materials powered by the pumps 6 of the steady-flow over-saturation loop reaction system. The unnecessary solid-state particles in the solution are filtered out by using the filter device 90, and then the filtered solution is supplied into the over-saturation reaction trough 80a of the steady-flow over-saturation loop reaction system through the valve control devices. There are three ways for supplying the solution into the over-saturation reaction trough 80a of the steady-flow over-saturation loop reaction system. By adjusting the valve control devices, the three ways are (1) through the pump 6, filter 106, and the heater 110 by heating and filtering; (2) through the pump 6 and filter 106 into the over-saturation reaction trough 80a by filtering without heating; and (3) through the pump 6 directly into the over-saturation reaction trough 80a without filtering and heating. In the preferred embodiment of the present invention, it is exemplified by an over-saturation reaction trough and two liquid level control troughs of a steady-flow over-saturation loop reaction system allowing over-flow on two opposite sides. The saturated and filtered solution is stopped being provided when the over-saturation reaction trough 80a is filled up with the saturated and filtered liquid and the saturated and filtered liquid over-flows into the liquid level control trough 80b to a pre-determined level controlled by a liquid level meter 114. The valve control devices are switched into a state in which the steady-flow over-saturation loop reaction system runs independently. In other words, The saturated solution is powered by the pump 6 to flow from the over-saturation reaction trough 80a into the liquid level control trough 80b, and then returns to the over-saturation reaction trough 80a. There are three ways returning the solution into the over-saturation reaction trough 80a of the steady-flow over-saturation loop reaction system. By adjusting the valve control devices, the three ways are (1) through the pump 6, filter 106, and the heater 110 by heating and filtering; (2) through the pump 6 and filter 106 into the over-saturation reaction trough 80a by filtering without heating; and (3) through the pump 6 directly into the over-saturation reaction trough 80a without filtering and heating.

Step 3: A substrate is provided into the over-saturation reaction trough 80a. Then reactants such as de-ionized water and $H_3BO_3$ are provided from the two supply devices 50 by the pump 8 and 10 into the over-saturation reaction trough 80a. Finally, a $SiO_2$ thin film is deposited onto the substrate when the saturated liquid becomes over-saturated. During the reaction, the generated particles can be filtered out by the filter device 106, the reaction temperature can be controlled by the heater 110 with a thermocouple 116, and the reaction conditions can be controlled by is the automatic solution concentration monitoring system 109. Moreover, the specially designed trough with a swing means 12 improves the uniformity of deposition. There is also provided a liquid level meter 114 for detecting the liquid level in the liquid level control trough 80b. Furthermore, there are also provided a filter jamming sensor 108, an over-heating sensor 118, and a pump protection sensor 120 to examine the operation of the system and keep it in a normal condition.

Step 4: The deposition operation is stopped when the concentration of the solution in the over-saturation reaction trough has reached the limitation of the over-saturation reaction trough. Meanwhile, the operation mode of the valve control devices is switched to an exhaust mode and the solution in the steady-flow over-saturation loop reaction system is powered by the pump 6 to flow through the valve control devices into the two storage troughs 55. A recycled waste liquid level sensor 102 for detecting the liquid level of the recycled waste liquids and a recycled waste liquid sensor 104 are also provided to confirm normal operation.

Step 5: The operation mode of the valve control devices is switched into a cleaning mode when the solution in the steady-flow over-saturation loop reaction system is entirely exhausted. De-ionized water 95 is added into the over-saturation reaction trough 80a until the over-saturation reaction trough 80a is filled up and the solution over-flows from the over-saturation reaction trough 80a into the liquid level control trough 80b. The de-ionized water 95 is stopped being provided and the operation mode of the vale control devices is switched to a loop mode so that the de-ionized water in the steady-flow over-saturation loop reaction system is powered by the pump 6 to over-flow from the over-saturation reaction trough 80a into the liquid level control trough 80b and further return to the over-saturation reaction trough 80a through the pump 6, the filter 106 and the heater 110. The loop operation lasts for several minutes and then the waste liquid is exhausted as described in Step 4. Otherwise, the liquid is directly exhausted with returning to the over-saturation reaction trough 80a.

Step 5 a: A step of cleaning the mixture trough 70 can be added. De-ionized water 95 is added into the mixture trough 70. After the unnecessary solid-state particles are filtered out by the filter 90, the waste liquid is exhausted into the two storage troughs 55 for storing the recycled waste liquids. Otherwise, the waste liquid is directly exhausted into the two storage troughs 55 without being filtered by the filter 90.

Step 6: After the cleaning step, the process goes back to Step 1 as a loop. Furthermore, the apparatus is also provided with a leakage sensor 112 to avoid waste liquid leakage and a plurality of manual sampling exits with the filters and the heaters to examine the operation state of the system.

It is preferable that the two storage troughs 55 are provided with a recycled waste liquid level sensor 102 for detecting the liquid level of the recycled waste liquids and a recycled waste liquid sensor 104 to confirm normal operation.

It is preferable that the apparatus for liquid phase deposition is provided with a leakage sensor 112 to monitor and detect the leakage during the whole fabrication process.

As discussed so far, in accordance with the present invention, there is provided an apparatus for liquid phase deposition, having the following advantages:

1. The present invention employs one-sided over-flow and two sided over-flow systems to perform low temperature liquid phase deposition so that good thin film reliability can be achieved.
2. The present invention provides temperature control devices so that high quality thin films with low thermal stress and low fabrication cost can be deposited by using temperature difference during 15 to 20° C.
3. The present invention provides with in-situ monitoring when de-ionized water is added to saturated $H_2SiF_6$ so that low k (k=3.2~3.7) silicon oxide can be deposited on the substrate.
4. The present invention provides a high-yield fabrication process that can effectively eliminate the contaminative particles, especially in the 0.18 □m fabrication process.
5. The present invention provides good deposition selectivity, achieving high throughput, high step-coverage, and low fabrication cost by overcoming the problems related to ion leakage.
6. The present invention can be applicable to advanced IC fabrication techniques such copper/low k material deposition, via holes and trench isolation fabrication, and gate oxide fabrication for poly-silicon thin-film transistors.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for liquid phase deposition, comprising the steps of:
   (a) providing an apparatus for liquid phase deposition, the apparatus has a saturation reaction system and a steady-flow over-saturation loop reaction system, the saturation reaction system including a mixture trough, at least two supply devices for raw materials, and valve control devices, the steady-flow over-saturation loop reaction system including an over-saturation reaction trough, at least one liquid level control trough, at least two said supply devices for raw materials, and said valve control devices connected to said saturation reaction system;

(b) providing at least two raw materials from at least two said supply devices of said saturation reaction system into said mixture trough;

(c) after stirring by said stirrer device until saturation, filtering out unnecessary solid-state particles by using said filter device;

(d) providing saturated and filtered liquid by using said pumps through said valve control devices into said over-saturation reaction trough of said steady-flow over-saturation loop reaction system;

(e) stopping providing said saturated and filtered liquid when said over-saturation reaction trough is filled up with said saturated and filtered liquid and said saturated and filtered liquid over-flows into said at least one liquid level control trough to a pre-determined level;

(f) switching said valve control devices into a state in which said steady-flow over-saturation loop reaction system runs independently;

(g) providing a substrate into said over-saturation reaction trough;

(h) providing reactants from said at least two supply devices into said over-saturation reaction trough;

(i) depositing a thin film into said substrate when said saturated liquid becomes over-saturated; and (j) changing the operation mode of said valve control devices to an exhaust mode when the concentration of said solution in said over-saturation reaction trough has reached the limitation of said over-saturation reaction trough.

2. A method for liquid phase deposition, comprising the steps of:

(a) providing an apparatus for liquid phase deposition, the apparatus has a saturation reaction system and a steady-flow over-saturation loop reaction system, the saturation reaction system including a mixture trough, at least two supply devices for raw materials, and valve control devices, the steady-flow over-saturation loop reaction system including an over-saturation reaction trough, at least one liquid level control trough, at least two said supply devices for raw materials, and said valve control devices connected to said saturation reaction system;

(b) providing at least two raw materials from at least two said supply devices of said saturation reaction system into said mixture trough;

(c) after stirring by said stirrer device until saturation, filtering out unnecessary solid-state particles by using said filter device;

(d) providing saturated and filtered liquid by using said pumps through said valve control devices into said over-saturation reaction trough of said steady-flow over-saturation loop reaction system;

(e) stopping providing said saturated and filtered liquid when said over-saturation reaction trough is filled up with said saturated and filtered liquid and said saturated and filtered liquid over-flows into said at least one liquid level control trough to a pre-determined level;

(f) switching said valve control devices into a state in which said steady-flow over-saturation loop reaction system runs independently;

(g) providing a substrate into said over-saturation reaction trough;

(h) providing reactants from said at least two supply devices into said over-saturation reaction trough;

(i) depositing a thin film into said substrate when said saturated liquid becomes over-saturated; and wherein the operation state of said waste liquid recycling system is examined by a recycled waste liquid level sensor for recycled waste liquid and a recycled waste liquid.

3. A method for liquid phase deposition, comprising the steps of:

(a) providing an apparatus for liquid phase deposition, the apparatus has a saturation reaction system and a steady-flow over-saturation loop reaction system, the saturation reaction system including a mixture trough, at least two supply devices for raw materials, and valve control devices, the steady-flow over-saturation loop reaction system including an over-saturation reaction trough, at least one liquid level control trough, at least two said supply devices for raw materials, and said valve control devices connected to said saturation reaction system;

(b) providing at least two raw materials from at least two said supply devices of said saturation reaction system into said mixture trough;

(c) after stirring by said stirrer device until saturation, filtering out unnecessary solid-state particles by using said filter device;

(d) providing saturated and filtered liquid by using said pumps through said valve control devices into said over-saturation reaction trough of said steady-flow over-saturation loop reaction system;

(e) stooping providing said saturated and filtered liquid when said over-saturation reaction trough is filled up with said saturated and filtered liquid and said saturated and filtered liquid over-flows into said at least one liquid level control trough to a pre-determined level;

(f) switching said valve control devices into a state in which said steady-flow over-saturation loop reaction system runs independently;

(g) providing a substrate into said over-saturation reaction trough;

(h) providing reactants from said at least two supply devices into said over-saturation reaction trough;

(i) depositing a thin film into said substrate when said saturated liquid becomes over-saturated;

(j) adding de-ionized water into said over-saturation reaction trough until said over-saturation reaction trough is filled up and said solution over-flows from said over-saturation reaction trough into said liquid level control trough;

(k) stopping providing said de-ionized water and switching the operation mode of said valve control devices of a loop mode; and (l) exhausting waste liquid.

* * * * *